(12) United States Patent
Wang et al.

(10) Patent No.: US 10,892,284 B2
(45) Date of Patent: Jan. 12, 2021

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Ming Wang, Beijing (CN); Wei Song, Beijing (CN); Hui Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/402,191

(22) Filed: May 2, 2019

(65) Prior Publication Data
US 2020/0168640 A1    May 28, 2020

(30) Foreign Application Priority Data
Nov. 23, 2018    (CN) .......................... 2018 1 1409045

(51) Int. Cl.
*H01L 23/544*    (2006.01)
*H01L 27/12*    (2006.01)
(Continued)

(52) U.S. Cl.
CPC .... *H01L 27/1262* (2013.01); *H01L 21/76832* (2013.01); *H01L 23/544* (2013.01);
(Continued)

(58) Field of Classification Search
CPC ........................ H01L 23/544; H01L 29/78669
(Continued)

(56) References Cited

U.S. PATENT DOCUMENTS 9,455,351 B1 * 9/2016 Zhou ................. H01L 29/78648
9,570,475 B2    2/2017 Cai et al.
(Continued)

FOREIGN PATENT DOCUMENTS

| CN | 102386322 A | 3/2012 |
|---|---|---|
| CN | 104299961 A | 1/2015 |
| CN | 105845710 A | 8/2016 |

OTHER PUBLICATIONS

Office Action issued in corresponding Chinese Patent Application No. 201811409045.9 dated Mar. 4, 2020.

*Primary Examiner* — David Vu
*Assistant Examiner* — Brandon C Fox
(74) *Attorney, Agent, or Firm* — McDermott Will & Emery LLP

(57) ABSTRACT

A display substrate, a manufacturing method thereof, and a display device are provided. According to embodiments of the present disclosure, the manufacturing method of a display substrate comprises: fabricating a gate electrode, a gate electrode insulating layer, and a semiconductor active layer sequentially on a base substrate; fabricating a first etching stopping layer and a second etching stopping layer on the base substrate with the semiconductor active layer fabricated thereon, wherein the first etching stopping layer is disposed in a display area of the display substrate, the second etching stopping layer is disposed in a peripheral area of the display substrate, and the second etching stopping layer is a non-transparent layer; and fabricating source/drain electrodes by a patterning process, on the base substrate with the first and second etching stopping layers fabricated thereon, wherein the second etching stopping layer is used as an alignment marker in fabricating the source/drain electrodes.

14 Claims, 4 Drawing Sheets

(51) Int. Cl.
    *H01L 21/768*     (2006.01)
    *H01L 27/32*     (2006.01)

(52) U.S. Cl.
    CPC ........ *H01L 27/127* (2013.01); *H01L 27/1218* (2013.01); *H01L 27/3244* (2013.01); *H01L 2223/54426* (2013.01)

(58) Field of Classification Search
    USPC .......................................... 257/43; 438/104
    See application file for complete search history.

(56) References Cited

U.S. PATENT DOCUMENTS

| | | | |
|---|---|---|---|
| 9,673,149 B2* | 6/2017 | Wu | H01L 23/544 |
| 10,304,875 B2* | 5/2019 | Lou | H01L 27/1225 |
| 2013/0095606 A1* | 4/2013 | Bayraktaroglu | H01L 29/7869 438/104 |
| 2016/0104727 A1* | 4/2016 | Cai | H01L 27/124 257/72 |
| 2017/0194397 A1* | 7/2017 | Kim | H01L 27/3251 |

* cited by examiner

DISPLAY SUBSTRATE, MANUFACTURING METHOD THEREOF, AND DISPLAY DEVICE

CROSS REFERENCE TO RELATED APPLICATION

The present application claims a priority benefit of Chinese Patent Application No. 201811409045.9, filed on Nov. 23, 2018, the entirety of which is incorporated herein by reference.

TECHNICAL FIELD

The present disclosure relates to the technical field of display, and particularly to a display substrate, a manufacturing method thereof, and a display device.

BACKGROUND

An organic light emitting diode (OLED) display substrate typically comprises a substrate, an anode, a hole transport layer made from an organic compound, an organic light emitting layer having a suitable dopant, an organic electron transport layer, and a cathode. OLED display substrates attract more and more attentions due to their advantages of low driving voltage, high luminance, wide view angle, full-color flat panel luminescence and display, and so on.

SUMMARY

The present disclosure provides a display substrate, a manufacturing method thereof, and a display device.

Embodiments of present disclosure mainly provide the following technical solutions.

In an aspect, the embodiments of the present disclosure provide a manufacturing method of a display substrate, comprising:

fabricating a gate electrode, a gate electrode insulating layer, and a semiconductor active layer sequentially on a base substrate;

fabricating a first etching stopping layer and a second etching stopping layer on the base substrate with the semiconductor active layer fabricated thereon, wherein the first etching stopping layer is disposed in a display area of the display substrate, the second etching stopping layer is disposed in a peripheral area of the display substrate, and the second etching stopping layer is a non-transparent layer; and fabricating source/drain electrodes by a patterning process, on the base substrate with the first etching stopping layer and the second etching stopping layer fabricated thereon, wherein the second etching stopping layer is used as an alignment marker during fabricating the source/drain electrodes.

Optionally, said fabricating a first etching stopping layer and a second etching stopping layer on the base substrate with the semiconductor active layer fabricated thereon comprises:

depositing a metal layer on the base substrate with the semiconductor active layer fabricated thereon;

patterning the metal layer by a patterning process, to form a patterned metal layer in the display area of the display substrate and form a second etching stopping layer in the peripheral area of the display substrate; and treating the patterned metal layer to form a transparent and insulative first etching stopping layer.

Optionally, a material of the metal layer comprises aluminum.

Optionally, said treating the patterned metal layer to form a transparent and insulative first etching stopping layer comprises:

subjecting the patterned metal layer to an oxidation treatment to convert the patterned metal layer to a transparent insulating layer.

Optionally, said subjecting the patterned metal layer to an anodic oxidation treatment comprises:

subjecting the patterned metal layer to an anodic oxidation treatment.

Optionally, said fabricating a gate electrode, a gate electrode insulating layer, and a semiconductor active layer sequentially on a base substrate is performed by a patterning process.

In another aspect, the embodiments of the present disclosure provide a display substrate, comprising:

a gate electrode, a gate electrode insulating layer, and a semiconductor active layer sequentially disposed on a base substrate;

a first etching stopping layer on the semiconductor active layer;

a second etching stopping layer; and source/drain electrodes on the first etching stopping layer, wherein the display substrate comprises a display area and a peripheral area, and the second etching stopping layer is disposed in the peripheral area.

Optionally, the second etching stopping layer is configured to be an alignment marker.

Optionally, the second etching stopping layer is a non-transparent layer.

Optionally, a material of the second etching stopping layer comprises aluminum.

Optionally, the first etching stopping layer is a transparent insulating layer.

Optionally, a material of the first etching stopping layer comprises aluminum oxide.

Optionally, the first etching stopping layer is disposed in the same layer as the second etching stopping layer.

Optionally, the display substrate is an organic electroluminescent display substrate.

In yet another aspect, the embodiments of the present disclosure provide a display device comprising the display substrate as described above.

BRIEF DESCRIPTION OF DRAWINGS

By means of reading the detailed description of the embodiments below, various advantages and benefits of the present application will become clear and apparent for one of ordinary skill in the art. The drawings are only intended for illustrating the embodiments, but should not be construed as limiting the embodiments of the present disclosure. In all the drawings, the same reference numbers indicate the same elements. In the drawings.

DETAILED DESCRIPTION

The applicant has discovered that during the manufacture of an OLED display substrate by an etching stopping layer (ESL) process, the procedure comprises the manufacture of a gate electrode, an etching stopping layer, and source/drain electrodes, wherein, when manufacturing the etching stopping layer, the etching stopping layer is required to be exposed in a state of aligning with alignment markers included in a film layer where the gate electrode is located, and when manufacturing the source/drain electrodes, the source or drain electrode is also required to be expose in a state of aligning with alignment markers included in the film layer where the gate electrode is located. However, when aligning the etching stopping layer with alignment markers included in the film layer where the gate electrode is located, a deviation offset will occur, and when aligning the source/drain electrodes with alignment markers included in the film layer where the gate electrode is located, a deviation offset will occur as well. This virtually increases the offset amount between the etching stopping layer and the source/drain electrodes, resulting in a short channel effect. As a result, the threshold voltage is shifted negatively, which greatly influences the overall display effect of the display substrate.

In order to at least partially solve the above problem, the present disclosure provides a display substrate, a manufacturing method thereof, and a display device, which can improve the alignment accuracy between the etching stopping layer and the source/drain electrodes and enhance the overall display effect of the display substrate.

The exemplary embodiments of the present disclosure will be described in detail below with reference to the drawings. Although the drawings show the exemplary embodiments of the present disclosure, it should be appreciated that the present invention can be realized in various manners, and should not be limited to the embodiments described herein. Rather, the embodiments are provided such that the present disclosure can be better understood by those skilled in the art.

Figure 1:
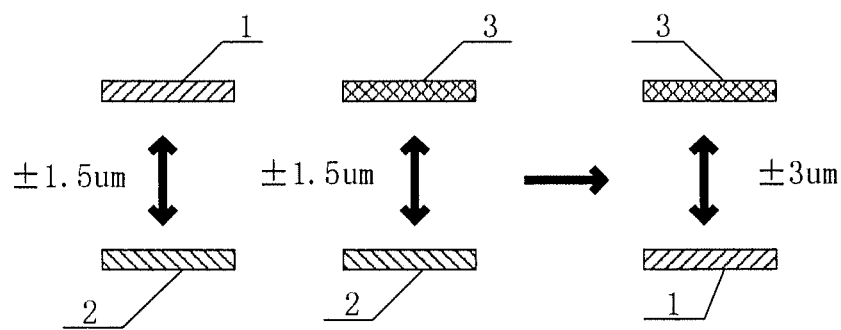
FIG. 1 is a schematic diagram showing an offset phenomenon between an etching stopping layer and a source electrode in related art.

FIG. 1 is a schematic diagram of an offset phenomenon between an etching stopping layer and a source electrode in related art. As shown in FIG. 1, in related display substrate manufacture process, when aligning the etching stopping layer 1 with alignment markers included in a film layer where the gate electrode 2 is located, a displacement deviation of ±1.5 µm may occur between the etching stopping layer 1 and the gate electrode 2, and such a displacement deviation is not controllable. Likewise, when aligning the source electrode 3 with alignment markers included in the film layer where the gate electrode 2 is located, a displacement deviation of ±1.5 µm may occur between the source electrode 3 and the gate electrode 2 as well. As a result, a displacement deviation of ±3 µm may occur between the source electrode 3 and the etching stopping layer 1. When the offset amount between the etching stopping layer and the source electrode is too large, it will result in a short channel effect, such that the threshold voltage is shifted negatively, thereby greatly influencing the overall display effect of the display substrate. FIG. 1 illustrates the case where the offset amount between the source electrode and the etching stopping layer is too large. Similarly, a problem of too large offset amount between the drain electrode and the etching stopping layer may also occur.

Figure 2:
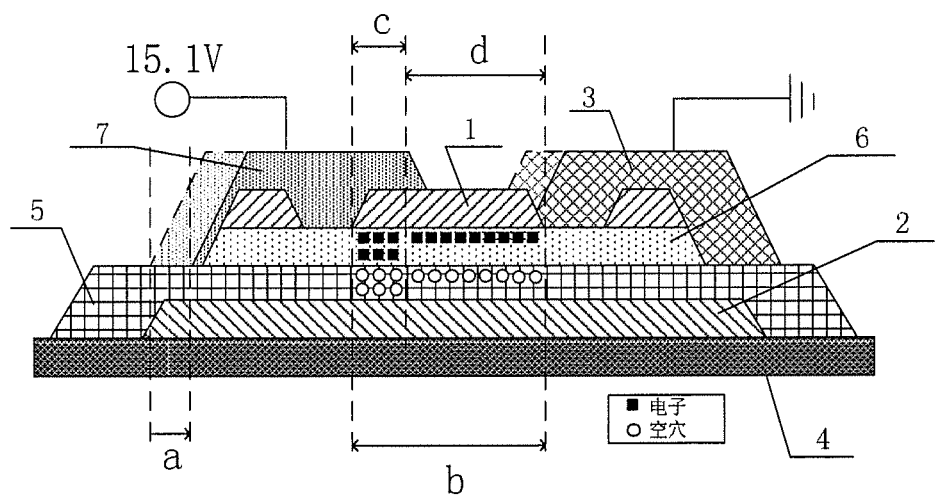
FIG. 2 is a schematic structural diagram of short channel effect in related art.

FIG. 2 shows a schematic structural diagram of the short channel effect in related art. The display substrate manufactured in related art comprises: a base substrate 4; and a gate electrode 2, a gate electrode insulating layer 5, a semiconductor active layer 6, an etching stopping layer 1, and a source electrode 3/a drain electrode 7 sequentially on the base substrate 4, wherein the material of the etching stopping layer 1 is silicon oxide.

As shown in FIG. 2, when the offset amount between the etching stopping layer 1 and the source/drain electrodes 3 and 7 is too large, a short channel effect will occur. By taking the drain electrode 7 as an example, in related art, after the drain electrode is manufactured in alignment, a rightward offset with a first length "a" may occur for the drain electrode. When a positive bias voltage of 15.1 V is provided for the drain electrode 7, too many electrons and holes are produced in a region covered by the drain electrode 7 (with a second length "c"), such that the length of the channel region having an original length "b" is reduced by a distance of the second length "c". That is, the actual length of the channel region is changed to a length "d". At this time, the capability of the gate electrode to control the channel region deteriorates, and thus the threshold voltage value is directly reduced, thereby influencing the overall display effect of the display substrate.

The embodiments of the present disclosure provide a manufacturing method of a display substrate, by which the above defect in related art can be at least partially alleviated or eliminated. The manufacturing method of a display substrate provided in the embodiments of the present disclosure will be described in detail below with reference to the drawings.

Figure 3:
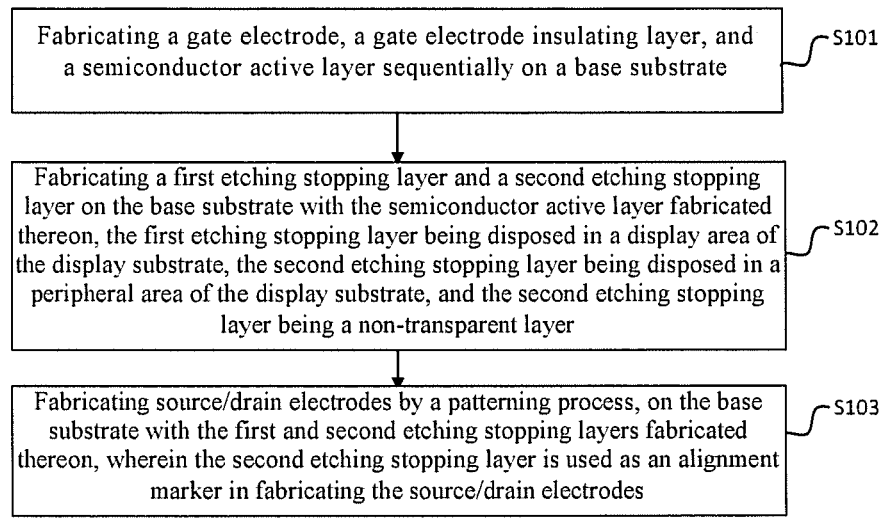
FIG. 3 is a flow chart of a manufacturing method according to an embodiment of the present disclosure.

FIG. 3 shows a flow chart of a manufacturing method of a display substrate according to an embodiment of the present disclosure. The method comprises the following steps.

S101: Fabricating a gate electrode, a gate electrode insulating layer, and a semiconductor active layer sequentially on a base substrate.

S102: Fabricating a first etching stopping layer and a second etching stopping layer on the base substrate with the semiconductor active layer fabricated thereon, the first etching stopping layer being disposed in a display area of the display substrate, the second etching stopping layer being disposed in a peripheral area of the display substrate, and the second etching stopping layer being a non-transparent layer.

S103: Fabricating source/drain electrodes by a patterning process, on the base substrate with the first and second etching stopping layers fabricated thereon, wherein the second etching stopping layer is used as an alignment marker in fabricating the source/drain electrodes.

Here, the gate electrode, the gate electrode insulating layer and the semiconductor active layer in S103 may be fabricated by a patterning process.

In the embodiments of the present disclosure, the first etching stopping layer and the second etching stopping layer are fabricated on the base substrate with the semiconductor active layer fabricated thereon, wherein the first etching stopping layer is disposed in the display area of the display substrate, the second etching stopping layer is disposed in the peripheral area of the display substrate, and the second etching stopping layer is a non-transparent layer used as an alignment marker in subsequent fabricating source/drain electrodes. As a result, when fabricating source/drain electrodes, it is possible to directly align with the second etching stopping layer, without the need of aligning with the alignment markers included in the film layer where the gate electrode is located in fabricating source/drain electrodes as in related art. This avoids a too large deviation between the etching stopping layer and the source/drain electrodes, thereby improving the accuracy of alignment between the etching stopping layer and the source/drain electrodes and enhancing the overall display effect of the display substrate.

In a particular embodiment, in S102, the step of fabricating the first etching stopping layer and the second etching stopping layer on the base substrate with the semiconductor active layer fabricated thereon comprises:

depositing a metal layer on the base substrate with the semiconductor active layer fabricated thereon;

patterning the metal layer by a patterning process to form a patterned metal layer in the display area of the display substrate and form the second etching stopping layer in the peripheral area of the display substrate; and treating the patterned metal layer to form the first etching stopping layer which is transparent and insulating.

In particular, for a bottom emitting type OLED display panel, the transparent and insulating first etching stopping layer can prevent the first etching stopping layer from shielding output light.

The patterning process in the embodiments of the present disclosure comprises some or all of applying of photoresist, exposing, developing, etching and photoresist stripping procedures.

In particular, in the embodiments of the present disclosure, the material of the metal layer deposited on the base substrate with the semiconductor active layer fabricated thereon comprises aluminum (Al). However, other suitable materials may also be selected by those skilled in the art according to practical conditions.

In particular, in the embodiments of the present disclosure, the step of treating the patterned metal layer to form the transparent and insulating first etching stopping layer comprises:

subjecting the patterned metal layer to an oxidation treatment to convert the patterned metal layer to a transparent insulating layer, said transparent insulating layer being the first etching stopping layer in the embodiments of the present disclosure.

Further, the step of subjecting the patterned metal layer to an oxidation treatment comprises subjecting the patterned metal layer to an anodic oxidation treatment. Herein, the anodic oxidation is an electrochemical oxidation process of a metal or alloy. By taking aluminum as an example, aluminum or an alloy thereof can form an oxide film layer on the aluminum article (anode) under the action of an externally applied current, using a correspondingn electrolytic solution and under particular process conditions. By this process, the patterned aluminum metal layer is converted to a transparent insulating material.

In the embodiments of the present disclosure, the metal material may comprise aluminum, i.e., the material of the patterned metal layer before oxidation comprises aluminum. Aluminum is converted to transparent and insulative aluminum oxide after oxidation, i.e., the transparent and insulative first etching stopping layer is formed after oxidation.

The manufacturing method of a display substrate provided in the embodiments of the present disclosure will be described in detail below with reference to the drawings.

FIG. 4 to FIG. 10 show the overall flow chart of the manufacture method of a display substrate according to the embodiments of the present disclosure.

Figure 4:
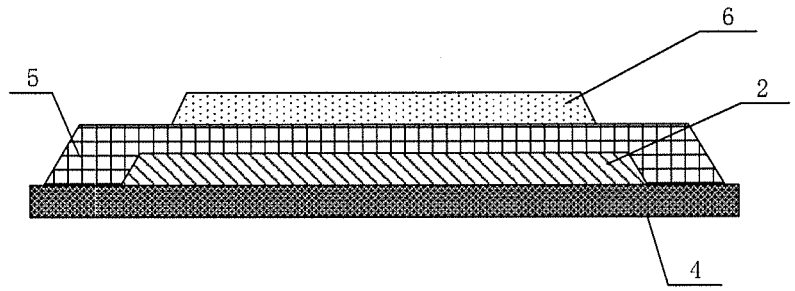
FIG. 4 is a schematic structural diagram showing the step of fabricating a gate electrode, a gate electrode insulating layer, and a semiconductor active layer sequentially on a base substrate according to an embodiment of the present disclosure.

As shown in FIG. 4, firstly, a gate electrode 2, a gate electrode insulating layer 5 and a semiconductor active layer 6 are fabricated sequentially on a base substrate 4, for example, by a patterning process. The fabrication processes of the gate electrode 2, the gate electrode insulating layer 5 and the semiconductor active layer 6 may be similar to those in prior art, and will not be reiterated here.

Figure 5:
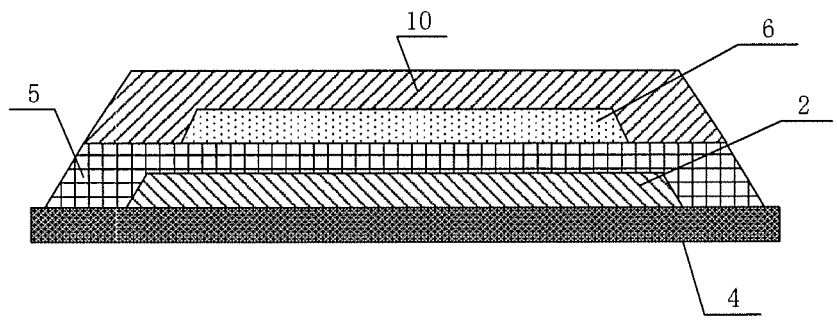
FIG. 5 is a schematic structural diagram showing the step of fabricating an etching stopping layer on the semiconductor active layer of FIG. 4.
Figure 6:
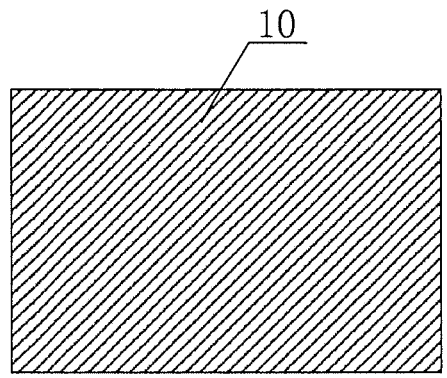
FIG. 6 is a top view of the display substrate of FIG. 5.
Figure 7:
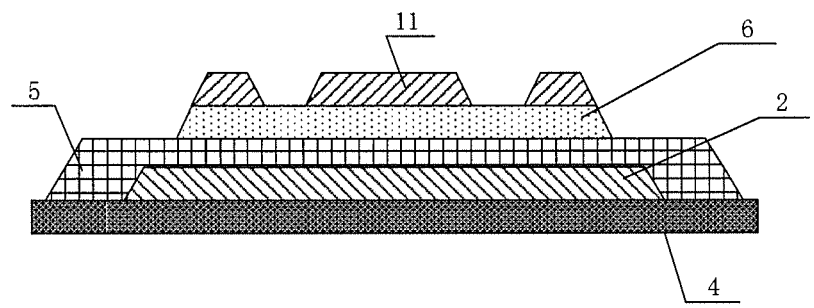
FIG. 7 is a schematic structural diagram showing the step of forming a patterned metal layer and a second etching stopping layer by subjecting the display substrate of FIG. 5 to a patterning process.
Figure 8:
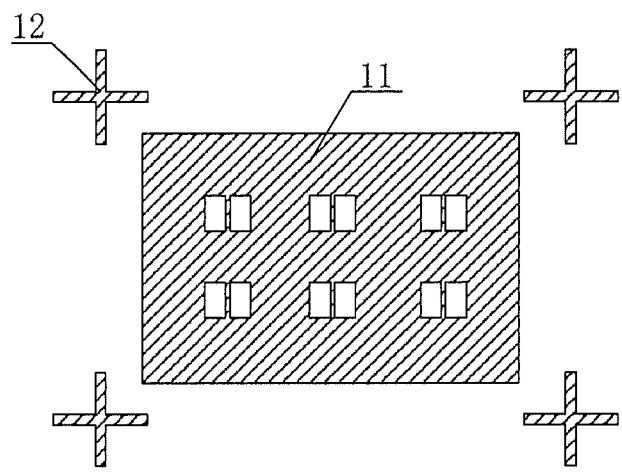
FIG. 8 is a top view of the display substrate of FIG. 7.

Next, as shown in FIG. 5 and FIG. 6, a metal layer 10 is deposited on the base substrate 4 of FIG. 4 with the semiconductor active layer 6 formed thereon. In particular implementation, an aluminum thin film layer is deposited on the base substrate 4 of FIG. 4. Thereafter, the metal layer 10 is patterned by a patterning process. In particular implementation, a photoresist is applied on the metal layer 10, and then steps of exposing, developing, etching and photoresist stripping off are performed, to form a patterned metal layer 11 in a display area of the base substrate 4, as shown in FIG. 7 and FIG. 8, and form a second etching stopping layer 12 in a peripheral area of the base substrate 4, as shown in FIG. 8. The second etching stopping layer 12 is used as an alignment marker in subsequent fabricating source/drain electrodes.

It should be noted that the second etching stopping layer 12 may be formed into a plurality of alignment markers. The shape of the alignment marker may be arbitrarily selected, for example, it may be a cross shape, a star shape or the like. The number of the alignment markers may be 2, 3, 4, 8, and so on. The plurality of the alignment markers may be disposed symmetrically or asymmetrically. For example, two alignment markers may be disposed at opposite angles or on opposite edges, or four alignment markers may be disposed at four angles or in the middle of four edges.

Figure 9:
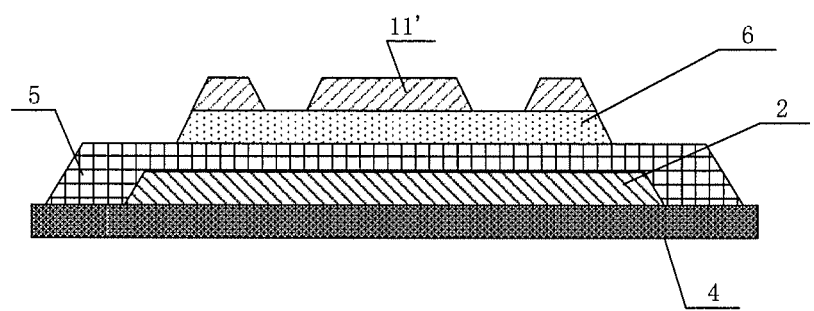
FIG. 9 is a schematic structural diagram showing the step of subjecting the display substrate of FIG. 7 to an oxidation treatment.
Figure 10:
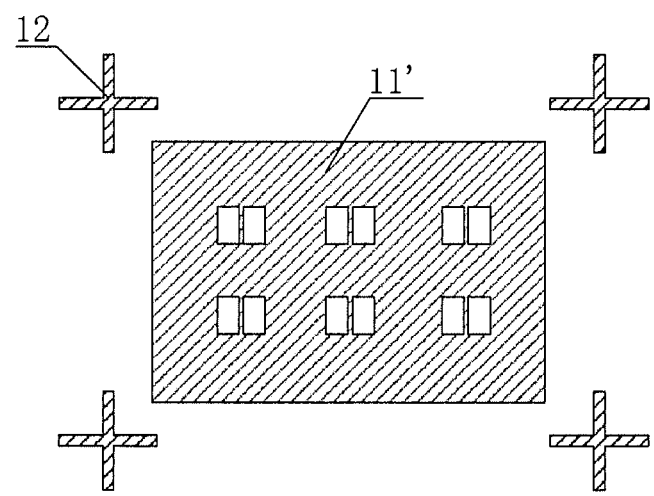
FIG. 10 is a top view of the display substrate of FIG. 9.

Then, with reference to FIG. 9 and FIG. 10, the patterned metal layer 11 in the display area is subjected to an oxidation treatment to form a transparent and insulative first etching stopping layer 11'. In particular, the oxidation treatment may be performed by an anodic oxidation. Of course, the oxidation treatment may also be performed by a heating oxidation or other process. In the embodiments of the present disclosure, the material of the patterned metal layer 11 is aluminum. Thus, after subjecting the patterned metal layer 11 to an oxidation treatment, the material of the first etching stopping layer 11' obtained is aluminum oxide. According to the material properties of aluminum oxide, the first etching stopping layer 11' is a non-conductive and transparent layer.

Finally, based on the second etching stopping layer 12, an exposure in alignment is carried out to form source/drain electrodes. The fabrication process of the source/drain electrodes may be similar to those in prior art, and will not be reiterated here.

In the embodiments of the present disclosure, when fabricating source/drain electrodes, the alignment is performed with the second etching stopping layer 12. Therefore, as compared to the related art in which the alignment is performed with the alignment markers included in the film layer where the gate electrode is located, the accuracy of alignment between the source/drain electrodes and the second etching stopping layer 12 (and the accuracy of alignment between the source/drain electrodes and the first etching stopping layer 11' accordingly) can be controlled within ±1.5 μm in the embodiments of the present disclosure, thereby greatly improving the accuracy of alignment and effectively improving the homogeneity of the threshold voltage.

The embodiments of the present disclosure also provide a display substrate. As shown in FIG. 9 and FIG. 10, the display substrate comprises: a gate electrode 2, a gate electrode insulating layer 5 and a semiconductor active layer 6 sequentially disposed on a base substrate 4; a first etching stopping layer 11' on the semiconductor active layer 6 and a second etching stopping layer 12 (wherein the first etching stopping layer 11' and the second etching stopping layer 12 may be disposed in the same layer); and source/drain electrodes on the first etching stopping layer 11'. Here, the first etching stopping layer 11' is disposed in a display area of the display substrate, and the second etching stopping layer 12 is disposed in a peripheral area of the display substrate. The second etching stopping layer 12 may be used as an alignment marker for source/drain electrodes.

In particular, the material of the second etching stopping layer 12 may comprise aluminum. The material of the first etching stopping layer 11' may comprise aluminum oxide.

In one embodiment, the display substrate may be an organic electroluminescent display substrate. In particular, the display substrate may be an OLED display substrate. However, for those skilled in the art, other suitable display substrates may also be used.

The embodiments of the present disclosure also provide a display device comprising the display substrate as described above.

The advantageous effects obtained by the embodiments of the present disclosure may comprise:

In the embodiments of the present disclosure, a first etching stopping layer and a second etching stopping layer are fabricated on the base substrate with the semiconductor active layer fabricated thereon, wherein the first etching stopping layer is disposed in the display area of the display substrate, the second etching stopping layer is disposed in the peripheral area of the display substrate, and the second etching stopping layer is a non-transparent layer used as an alignment marker in subsequent fabricating source/drain electrodes. As a result, when fabricating source/drain electrodes, it is possible to directly align with the second etching stopping layer, without the need of aligning with alignment markers included in the film layer where the gate electrode is located in fabricating source/drain electrodes as in related art. This avoids a too large deviation between the etching stopping layer and the source/drain electrodes, thereby improving the accuracy of alignment between the etching stopping layer and the source/drain electrodes and enhancing the overall display effect of the display substrate.

The above description is only a part of the embodiments of the present disclosure. It should be noted that some modifications and variations can be made by one of ordinary skill in the art without departing from the principle of the present invention. These modifications and variations should also be regarded as falling into the protection scope of the present invention.

What is claimed is:

1. A manufacturing method of a display substrate, comprising:
    fabricating a gate electrode, a gate electrode insulating layer, and a semiconductor active layer sequentially on a base substrate;
    fabricating a first etching stopping layer and a second etching stopping layer on the base substrate with the semiconductor active layer fabricated thereon, wherein the first etching stopping layer is disposed in a display area of the display substrate, the second etching stopping layer is disposed in a peripheral area of the display substrate, and the second etching stopping layer is a non-transparent layer; and
    fabricating source/drain electrodes by a patterning process, on the base substrate with the first etching stopping layer and the second etching stopping layer fabricated thereon, wherein the second etching stopping layer is used as an alignment marker in fabricating the source/drain electrodes.

2. The manufacturing method according to claim 1, wherein said fabricating a first etching stopping layer and a second etching stopping layer on the base substrate with the semiconductor active layer fabricated thereon comprises:
    depositing a metal layer on the base substrate with the semiconductor active layer fabricated thereon;
    patterning the metal layer by a patterning process, to form a patterned metal layer in the display area of the display substrate and form a second etching stopping layer in the peripheral area of the display substrate; and
    treating the patterned metal layer to form a transparent and insulative first etching stopping layer.

3. The manufacture method according to claim 2, wherein a material of the metal layer comprises aluminum.

4. The manufacture method according to claim 3, wherein said treating the patterned metal layer to form a transparent and insulative first etching stopping layer comprises:
    subjecting the patterned metal layer to an oxidation treatment to convert the patterned metal layer to a transparent insulating layer.

5. The manufacture method according to claim 4, wherein said subjecting the patterned metal layer to an oxidation treatment comprises:
    subjecting the patterned metal layer to an anodic oxidation treatment.

6. The manufacture method according to claim 1, wherein said fabricating a gate electrode, a gate electrode insulating layer, and a semiconductor active layer sequentially on a base substrate is performed by a patterning process.

7. A display substrate comprising:
    a gate electrode, a gate electrode insulating layer, and a semiconductor active layer sequentially disposed on a base substrate;
    a first etching stopping layer on the semiconductor active layer;
    a second etching stopping layer; and
    source/drain electrodes on the first etching stopping layer,
    wherein the display substrate comprises a display area and a peripheral area, and the second etching stopping layer is a non-transparent layer disposed in the peripheral area.

8. The display substrate according to claim 7, wherein the second etching stopping layer is configured to be an alignment marker.

9. The display substrate according to claim 7, wherein a material of the second etching stopping layer comprises aluminum.

10. The display substrate according to claim 7, wherein the first etching stopping layer is a transparent insulating layer.

11. The display substrate according to claim 7, wherein a material of the first etching stopping layer comprises aluminum oxide.

12. The display substrate according to claim 7, wherein the first etching stopping layer is disposed in the same layer as the second etching stopping layer.

13. The display substrate according to claim 7, wherein the display substrate is an organic electroluminescent display substrate.

14. A display device comprising the display substrate according to claim 7.

* * * * *